(12) United States Patent
Zitzlsperger et al.

(10) Patent No.: US 12,027,656 B2
(45) Date of Patent: Jul. 2, 2024

(54) OPTOELECTRONIC SEMICONDUCTOR COMPONENT AND METHOD FOR PRODUCING OPTOELECTRONIC SEMICONDUCTOR COMPONENTS

(71) Applicant: OSRAM Opto Semiconductors GmbH, Regensburg (DE)

(72) Inventors: Michael Zitzlsperger, Regensburg (DE); Matthias Goldbach, Pentling (DE); Benjamin Höflinger, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 391 days.

(21) Appl. No.: 17/431,073

(22) PCT Filed: Feb. 17, 2020

(86) PCT No.: PCT/EP2020/054085
§ 371 (c)(1),
(2) Date: Aug. 13, 2021

(87) PCT Pub. No.: WO2020/169524
PCT Pub. Date: Aug. 27, 2020

(65) Prior Publication Data
US 2022/0140215 A1    May 5, 2022

(30) Foreign Application Priority Data
Feb. 20, 2019  (DE) .......................... 102019104325.5

(51) Int. Cl.
*H01L 27/15*     (2006.01)
*H01L 23/495*    (2006.01)
(Continued)

(52) U.S. Cl.
CPC ............ *H01L 33/62* (2013.01); *H01L 23/495* (2013.01); *H01L 25/0753* (2013.01);
(Continued)

(58) Field of Classification Search
CPC ...... H01L 23/495; H01L 33/486; H01L 33/60
(Continued)

(56) References Cited

U.S. PATENT DOCUMENTS 6,335,548 B1 * 1/2002 Roberts .................. H01L 33/54
257/89
6,583,444 B2 * 6/2003 Fjelstad ................ H01L 21/568
257/730
(Continued)

FOREIGN PATENT DOCUMENTS

DE    102013220360 A1   4/2014
DE    102013210668 A1   12/2014
(Continued)

OTHER PUBLICATIONS

International Search Report for International Patent Application No. PCT/EP2020/054085, dated May 13, 2020 (7 pages).

*Primary Examiner* — Nitin Parekh
(74) *Attorney, Agent, or Firm* — ARENTFOX SCHIFF LLP

(57) ABSTRACT

In one embodiment, the optoelectronic semiconductor device comprises at least two metallic lead frame parts and a circuit chip on the lead frame parts. An electrically insulating and opaque matrix material mechanically connects the lead frame parts. The circuit chip is embedded in the matrix material, so that a carrier is formed by the matrix material together with the lead frame parts and the circuit chip. An optoelectronic semiconductor chip is provided on (Continued)

a carrier upper side. Furthermore, the semiconductor device comprises at least one optical component on the carrier upper side.

20 Claims, 9 Drawing Sheets

(51) Int. Cl.
*H01L 25/075* (2006.01)
*H01L 33/00* (2010.01)
*H01L 33/48* (2010.01)
*H01L 33/60* (2010.01)
*H01L 33/62* (2010.01)

(52) U.S. Cl.
CPC .......... *H01L 33/005* (2013.01); *H01L 33/486* (2013.01); *H01L 33/60* (2013.01); *H01L 2933/0058* (2013.01); *H01L 2933/0066* (2013.01)

(58) Field of Classification Search
USPC ...................................... 257/79, 98, 432–433
See application file for complete search history.

(56) References Cited

U.S. PATENT DOCUMENTS

| | | | |
|---|---|---|---|
| 6,674,159 B1* | 1/2004 | Peterson | H01L 27/14618 257/434 |
| 7,256,140 B2* | 8/2007 | Call | H01L 31/208 438/758 |
| 2006/0267040 A1 | 11/2006 | Baek et al. | |
| 2009/0316315 A1 | 12/2009 | Wang et al. | |
| 2012/0112237 A1 | 5/2012 | Zheng et al. | |
| 2012/0187430 A1* | 7/2012 | West | H01L 33/62 257/E33.056 |
| 2012/0313131 A1* | 12/2012 | Oda | H01L 33/56 257/E33.072 |
| 2013/0320471 A1 | 12/2013 | Luan | |
| 2015/0034987 A1 | 2/2015 | Hayashi et al. | |
| 2015/0255313 A1* | 9/2015 | Brandl | H01L 31/0203 438/113 |
| 2020/0173617 A1* | 6/2020 | Bancken | B29C 45/14639 |

FOREIGN PATENT DOCUMENTS

| | | |
|---|---|---|
| DE | 102016103059 A1 | 8/2017 |
| EP | 1622237 A1 | 2/2006 |
| EP | 3340296 A1 | 6/2018 |

* cited by examiner

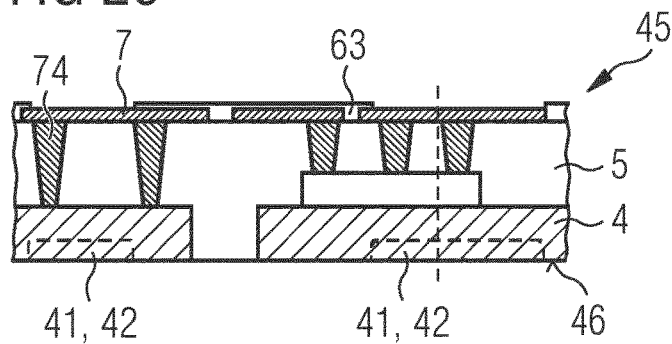
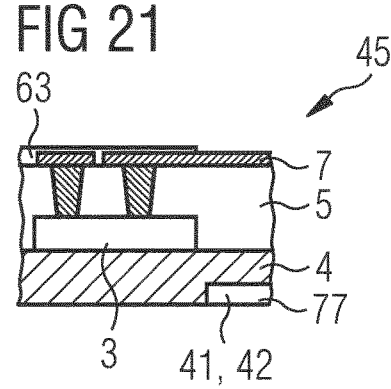
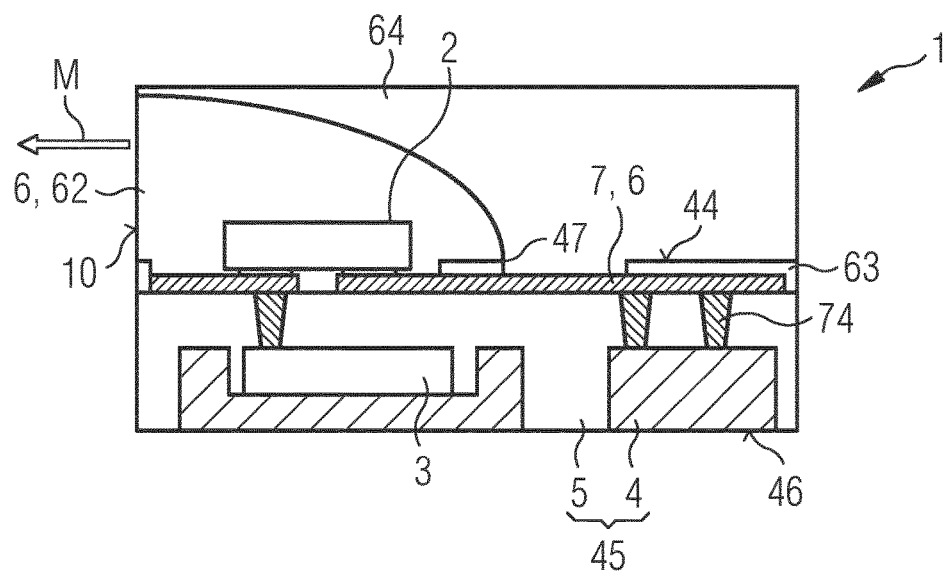
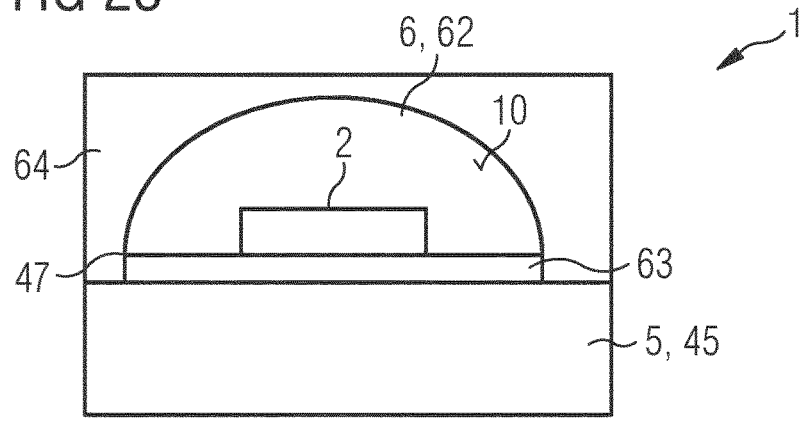

OPTOELECTRONIC SEMICONDUCTOR COMPONENT AND METHOD FOR PRODUCING OPTOELECTRONIC SEMICONDUCTOR COMPONENTS

This application is a 35 U.S.C. § 371 National Phase of PCT Application No. PCT/EP2020/054085, filed on Feb. 17, 2020, which claims priority to German Patent Application No. 102019104325.5, filed Feb. 20, 2019, the disclosures of each of which are hereby incorporated by reference herein in their entireties.

An optoelectronic semiconductor device is specified. Furthermore, a manufacturing method for an optoelectronic semiconductor devices is specified.

One task to be solved is to specify an optoelectronic semiconductor device that can be efficiently electronically driven and that is formed space saving.

This task is solved, inter alia, by an optoelectronic semiconductor device with the features of claim 1. Preferred further developments are the subject of the remaining claims.

According to at least one embodiment, the semiconductor device comprises two or more than two lead frame parts. The lead frame parts are metallic. For example, the lead frame parts are formed from a copper sheet or from a sheet of a copper alloy. The lead frame parts are created, for example, by stamping and/or cutting. The lead frame parts may be solid metal bodies.

According to at least one embodiment, the semiconductor device comprises one or more circuit chips. The at least one circuit chip is located on at least one of the lead frame parts. The circuit chip is an integrated circuit, in particular an application-specific integrated circuit, or ASIC for short.

According to at least one embodiment, the semiconductor device comprises an electrically insulating matrix material, such as a plastic. Preferably, the matrix material is opaque. By means of the matrix material, the lead frame parts are mechanically firmly connected to each other. Preferably, the circuit chip is embedded in the matrix material. That is, the circuit chip may be completely surrounded all around by the matrix material together with the lead frame parts.

According to at least one embodiment, a carrier is formed by the matrix material together with the lead frame parts. The circuit chip is thus accommodated in the carrier. The carrier may be a circuit board, in particular a printed circuit board, or a circuit board comprising the lead frame parts and the circuit chip.

According to at least one embodiment, the semiconductor device comprises one or more optoelectronic semiconductor chips. The at least one semiconductor chip is preferably a light emitting diode chip, a laser diode chip, and/or a photodetector chip. In particular, radiation-emitting semiconductor chips, such as light-emitting diode chips, and light-detecting semiconductor chips, such as photodetectors, are present in combination.

According to at least one embodiment, the at least one optoelectronic semiconductor chip is located on a carrier upper side of the carrier. This does not preclude the semiconductor chip from being partially recessed into the carrier. The carrier upper side is opposite to a mounting side. The mounting side is configured for mounting the semiconductor device. For example, the mounting side is configured such that the semiconductor device can be soldered or glued at the mounting side. In particular, all external electrical contact regions of the semiconductor device are located at the mounting side.

According to at least one embodiment, the semiconductor device comprises one or more optical components. The at least one optical component is configured for a reflection and/or for a refraction of radiation generated during operation and/or of radiation to be detected during operation. The at least one optical component is located on the carrier upper side. The optical component may be attached to the carrier upper side, for example directly via a casting process or an injection process, or indirectly via a bonding agent. Further, it is possible for the optics component to form part of the carrier upper side. That is, the optical component may be an integral part of the carrier.

In at least one embodiment, the optoelectronic semiconductor device comprises at least two metallic lead frame parts and at least one circuit chip on the lead frame parts. An electrically insulating and opaque matrix material mechanically connects the lead frame parts. The circuit chip is embedded in the matrix material so that a carrier is formed by the matrix material together with the lead frame parts and the circuit chip. At least one optoelectronic semiconductor chip is located on a carrier upper side of the carrier, wherein the carrier upper side is opposite to a mounting side. Further, the semiconductor device includes at least one optical component on the carrier upper side.

For light emitting diode devices and other optoelectronic devices, for example emitter-detector combinations, as room lighting, headlights or so-called light kernels, a higher integration of different functionalities is often required. In particular, the integration of more complex ASICs places high demands on a package for the component. For example, a large number of electrical connections may be required, such as the need for electrical redistribution layers, and small structure sizes may be present. These requirements cannot usually be met by common LED packages.

Therefore, in common light-emitting diode devices, an ASIC is normally placed in a separate location as a separate component on a printed circuit board. This results in an increased expenditure of space and intermediate electrical connections. In addition, the associated longer electrical leads result in disadvantages such as higher switching times.

In the semiconductor device described here, a circuit chip such as an ASIC is integrated into a package or substrate for an optoelectronic semiconductor chip. This reduces the space requirement of the semiconductor device. Furthermore, it is possible to design the semiconductor device as a side emitter, also referred to as sidelooker.

In particular, in the semiconductor device described here, so-called intelligent substrates such as Semiconductor Embedded in Substrate, or SESUB, or Embedded Active System Integration, or EASI, are modified and optimized for use as LED substrates. This allows LED chips and other optoelectronic chips to be placed on the SESUB or on the EASI substrate with the circuit chip.

By default, an ASIC package or an EASI substrate are only conditionally suitable for use as a carrier for optoelectronic semiconductor chips, especially for LEDs. In the component described here, modifications are used to achieve increased usability as an LED carrier. In further process steps, the carrier comprising the circuit chip can be encapsulated or overmolded with the optoelectronic semiconductor devices mounted thereon. Such processes can be used to create reflectors, lenses and light-emitting layers with which a radiation characteristic of the semiconductor device can be adjusted. In particular, side-emitting semiconductor devices can be achieved.

Exemplary modifications and adjustments of, for example, EASI substrates for semiconductor devices described here are, individually or in any combination:

- Suitable reflective coatings are used for the emission colors of the light-emitting diodes, for example of silver, in order to achieve increased reflectivity.
- Passivation of metallic coatings in particular can be carried out, for example after optoelectronic semiconductor chips have been applied, to ensure high reflectivity over a lifetime of the component.
- Large-area metallizations can be created on the side with the semiconductor chip to provide a larger reflector area.
- A top layer of the carrier can be made of a white laminate to provide increased diffuse reflectivity.
- The carrier and semiconductor chip can be overmolded or encapsulated with a reflective material to protect the carrier from short wavelength radiation, such as ultraviolet radiation, and to provide increased reflectivity.
- Surface patterning of an EASI substrate can be carried out, for example, by creating cavities or fabricating structural edges to form optics in a defined manner.
- Optoelectronic semiconductor chips can be partially or fully embedded in an EASI substrate.
- A laminate layer transparent to the emission wavelength of the light emitting diode chip or a detector chip can be created over the optoelectronic semiconductor chips.
- Components for an adjustment of spectral emission properties can be brought in layers, such as transparent laminate layers, for example luminescent substances and/or dyes.
- Redistribution layers, RDL for short, can be used as conductor paths, structural edges and/or apertures for higher optical contrasts.
- For example, sapphire flip chips, surface-emitting flip chips, volume-emitting semiconductor chips, vertical surface-emitting semiconductor chips, substrate-less semiconductor chips, LED chips with a luminescent substance, combinations of LED chips such as RGB units, detector chips such as photodiode chips, combinations of LED chips and detector chips can be used as optoelectronic semiconductor chips.
- Potting materials can be clear potting, potting with infrared filtering materials, or potting with luminescent substances, such as volume wavelength conversion elements.
- Cavities in or on the carrier can be rectangular in shape, approximately semi-parabolic or semi-lenticular, or trapezoidal. A profiled socket can be formed around the semiconductor chip so that more than semi-parabolic or more than semi-lenticular cavities can be achieved, also in combination with imprintings and/or back etchings in the carrier.
- White reflector potting around a semiconductor chip can be used in particular for surface emitters. Structural edges on the carrier upper side can be used to produce structured reflectors, for example via compression molding. Bars and/or ramparts can be formed around a cavity to prevent an optical waveguide through the material deposited by overmolding.
- Reflectors made of layers with different refractive indices can be applied to achieve higher reflectivity. In particular, partial delamination of layers can be intentionally induced to obtain totally reflective components.
- Cavities for lateral emission in a direction parallel to the mounting side can be open on a single side, on two sides, on three sides, or all around on four sides.
- Printed circuit boards, lead frame-based components, so-called premold components, SESUBs, EASI substrates, ceramic carriers, multilayer carriers, DCB components or DPC components can be used as carriers or substrates. DCB stands for Direct Copper Bonding and DPC for Direct Plated Copper.
- The optoelectronic semiconductor chips are mounted on the carrier by means of bonding, eutectic bonding, soldering, silver sintering or Velcro welding, for example.
- An electrical connection to electrical redistribution layers or leadframes is made, for example, by wire bonding or planar electrical connection layers.
- Instead of a combination of optoelectronic semiconductor chips, complete LED packages or chip-sized packages, CSP for short, can also be mounted on the carrier. For example, it is possible to build a CSP array with corresponding semiconductor chips on a smart carrier to create an ADB light source. ADB stands for Advanced Driving Beam, in particular a headlight with additional functions.

With the semiconductor device described here, it is possible to achieve a vertical rather than a lateral structure of the various types of semiconductor chips and circuit chips. By eliminating the need for wiring layers within an LED package, more design freedom is achieved. The semiconductor device is mechanically stable and robust to handle, for example in a pick-and-place process.

The carrier with the circuit chip can be tested for functionality before the optoelectronic semiconductor chips are mounted. Electrical capacitances are minimized, allowing high drive frequencies. Especially for side-emitting semiconductor devices, a required substrate area can be minimized, since an area of the semiconductor device can be equal to an area of the EASI substrate.

A light emitting surface of the semiconductor device is close to its upper side, especially above the carrier surface, so that emission does not occur directly at the mounting side. A large portion of the emitted radiation can be reflected within the semiconductor device before exiting the semiconductor device, which can lead to efficient color mixing in multichip devices.

A large variability of cavity profiles can be achieved with little effort, since injection molding steps with special molds can be omitted, especially due to suitable structural edges on the carrier upper side. Since there is no injection molding or compression molding, silicone base layers, which can act as loss channels of light, can be avoided. Low-cost processes can be used to manufacture the semiconductor device.

According to at least one embodiment, the semiconductor device comprises one or more electrical redistribution layers, also referred to as RDL. Furthermore, the semiconductor device comprises one or more electrical through-connections. By means of the through-connections, an electrical connection is established between the lead frame parts and the redistribution layers.

According to at least one embodiment, the circuit chip and the optoelectronic semiconductor chip are located in different planes. The different planes are preferably oriented parallel to the mounting side. In particular, the semiconductor chip is located closer to the mounting side than the optoelectronic semiconductor chip.

According to at least one embodiment, the circuit chip and the optoelectronic semiconductor chip overlap as seen in a plan view. That is, the semiconductor chip is partially or completely above the circuit chip.

According to at least one embodiment, the optical component or is at least one of the optical components formed by a reflection layer. The reflection layer may be a part of the carrier. For example, the reflection layer is a laminate layer on the carrier upper side or a reflective coating on the lead frame parts and/or the redistribution layer.

According to at least one embodiment, the optoelectronic semiconductor chip rises above the reflection layer in a direction away from the mounting plane. That is, the reflection layer may be designed to be relatively thin. Alternatively, it is possible for there to be a comparatively thick reflection layer that is flush with the semiconductor chip in the direction away from the mounting side or that projects above the semiconductor chip.

According to at least one embodiment, the optoelectronic semiconductor chip is arranged spaced apart from the circuit chip. That is, the semiconductor chip and the circuit chip do not touch. Preferably, there is not only one bonding agent between the semiconductor chip and the circuit chip. For example, a portion of the matrix material and/or a redistribution layer and/or electrical through-connections are arranged between the semiconductor chip and the circuit chip.

According to at least one embodiment, the semiconductor chip or one of the semiconductor chips is arranged on or in the redistribution layer or also on or in one of the lead frame parts. The lead frame parts and/or the redistribution layer may thus comprise cutouts for the semiconductor chip. Such cutouts are, for example, back etchings.

According to at least one embodiment, the semiconductor device comprises a plurality of the redistribution layers. The circuit chip is preferably disposed between two of the redistribution layers. One of the redistribution layers is preferably located between the circuit chip and the semiconductor chip or at least one of the semiconductor chips.

According to at least one embodiment, the optical component or is at least one of the optical components formed by a lens. The lens is preferably a light collecting lens or a lens parallelizing a beam coming from the semiconductor chip. For example, the lens is made of a plastic such as a silicone.

According to at least one embodiment, the lens is bounded in a direction parallel to the mounting side by a structural edge on the carrier upper side. The structural edge forms an elevation beyond remaining regions of the carrier upper side, or the structural edge is formed by a groove or trench in the carrier upper side. When the lens is dispensed, a material for the lens runs to the structural edge in a defined manner. Thus, a shape of the lens can be efficiently defined.

According to at least one embodiment, the structural edge is formed in multiple layers, alternatively only by a single layer. In the case of a multilayer structural edge, the structural edge preferably comprises one or more laminate layers of the carrier and preferably also at least one electrical redistribution layer. The layers forming the structural edge, as seen in a plan view, may be congruent or comprise different horizontal sections from each other.

According to at least one embodiment, several of the optics components are present. Preferably, differently acting optical components are present in combination with each other, for example lenses, specular reflecting layers and/or diffuse reflecting layers.

According to at least one embodiment, one of the optical components is formed by an opaque diffusely reflective cover layer. For example, the cover layer is made of a plastic such as a silicone to which reflective particles, preferably of titanium dioxide, are added.

According to at least one embodiment, the cover layer partially or completely covers the lens on a side facing away from the carrier. This means, for example, that in the direction perpendicular to the mounting side, no or no significant light component exits from the semiconductor device.

According to at least one embodiment, the carrier upper side is formed in places by the laminate layer. The laminate layer is made of an electrically insulating and preferably opaque material, in particular a plastic such as a solder resist. The laminate layer partially covers the electrical redistribution layer. The laminate layer may be colored to be reflective to radiation generated in operation or to be detected in operation. That is, the laminate layer may form one of the optical components or may form the optical component.

According to at least one embodiment, the optoelectronic semiconductor chip or at least one of the optoelectronic semiconductor chips or all semiconductor chips are partially or fully embedded in the matrix material. In a direction away from the mounting side or on side surfaces of the semiconductor device, the matrix material may be flush with the semiconductor chip. The matrix material may be directly adjacent to the semiconductor chip. Alternatively, the matrix material is present only on a single side of the semiconductor chip, so that the semiconductor chip is outside the carrier. In that case, the semiconductor chip preferably does not touch the matrix material.

According to at least one embodiment, a main emission direction of the semiconductor device is oriented parallel or approximately parallel to the mounting side. Approximately parallel means, for example, an angular tolerance of at most 20° or 10° or 5°. That is, the semiconductor device is a side emitter, also referred to as sidelooker.

According to at least one embodiment, the optical component or one or more of the optical components or all of the optical components are diffractive optical elements, DOE for short. The at least one optical component is in particular in this case for example made of a glass or of a transparent plastic. Microstructures may be brought into a material for the optical component, for example by means of photolithography.

In particular, in the case where the optical component is a DOE, the optical component may provide beam shaping, for example, in a vertically emitting laser, or VCSEL.

Furthermore, especially in the case of a DOE, the optical component can also be used independently of the optoelectronic components in the semiconductor device, as an alignment structure or arrangement structure for mounting the semiconductor device or for a placement of the semiconductor device for example on a printed circuit board, especially on a printed circuit board or PCB for short, or for the alignment of the semiconductor device relative to external optical components.

According to at least one embodiment, the optical component or at least one of the optical components or all optical components are flush with the carrier in a direction parallel to the mounting side. For example, the respective optical component and the carrier are separated in a common separation step. In this case, an emission preferably takes place laterally in a direction parallel or approximately parallel to the mounting side.

According to at least one embodiment, the semiconductor device comprises a plurality of the optoelectronic semiconductor chips. The semiconductor chips may be of identical design or of different design from each other. For example, semiconductor chips for generating red light, green light, and blue light are provided. The semiconductor chips may be arranged in pixels.

For example, a number of the semiconductor chips of the semiconductor device is at least 1 or 5 or 10 and/or at most 250 or 100 or 40.

Alternatively, a number of the semiconductor chips is at least $10^5$ or $10^6$ or $10^7$. In this case the semiconductor device may be, for example, a display.

According to at least one embodiment, the semiconductor chips can be controlled electrically independently of one another, individually or in groups, by means of the at least one circuit chip. In particular, semiconductor chips emitting different colors can be operated independently of each other to adjust a color of the light emitted by the semiconductor device during operation.

According to at least one embodiment, the semiconductor device comprises a data input interface. For example, the data input interface is formed by one or by two electrical contact regions. Preferably, a data input interface is provided for all semiconductor chips in common. The data input interface is preferably electrically connected directly to the circuit. A processing of a data signal at the data input interface preferably takes place in the circuit chip. By means of the circuit chip, the semiconductor chips are then controlled in accordance with the data signal.

If at least one of the semiconductor chips is a photodetector, it is possible that the signal from the photodetector is processed in the circuit chip and output in digitized form at a data output interface, for example. If several detecting semiconductor chips are present, there is preferably only a single data output interface common to all semiconductor chips, which can be electrically connected directly with the circuit chip.

According to at least one embodiment, the lead frame parts are exposed on side surfaces of the carrier. For example, the lead frame parts comprise at least one solder control point on each of the side surfaces. The solder control point is formed by a laterally exposed cutout in the respective lead frame part. The solder control point can be used to determine, viewed laterally onto the semiconductor device, whether a soldering process for attaching the semiconductor device has been carried out correctly. A coating of the lead frame parts may be present at the solder control points to ensure that the solder control points are wetted with a solder.

With solder control points or other such embodiments or structures at a position to be soldered on the respective lead frame part, a floating-in behavior during soldering can be favorably influenced.

Furthermore, a manufacturing method is specified. The manufacturing method is used to produce optoelectronic semiconductor devices as described in connection with one or more of the above embodiments. Features of the manufacturing method are therefore also disclosed for the semiconductor devices, and vice versa.

In at least one embodiment, the manufacturing process comprises the following steps, in particular in the order indicated:
  A) Providing the carriers in a carrier assembly;
  B) Applying the optoelectronic semiconductor chips to the carriers;
  C) Producing at least some of the optical components; and
  D) Separating to form the semiconductor devices.

According to at least one embodiment, the optical components or at least some of the optical components are formed by lenses. Preferably, the lenses are formed by dispensing.

According to at least one embodiment, the separation in step D) is performed through the lenses. The lenses are preferably covered by the diffuse reflective cover layer before the separation, so that the separation can also take place through the cover layer. In this way, lateral emission of the semiconductor devices can be achieved.

In the following, an optoelectronic semiconductor device described herein and a method described herein are explained in more detail with reference to the drawings by means of exemplary embodiments. Identical reference signs specify identical elements in the individual figures. However, no references to scale are shown; rather, individual elements may be shown exaggeratedly large for better understanding.

In the figures:

FIGS. 20 and 21 show schematic sectional views along different sectional directions of a carrier for optoelectronic semiconductor devices described herein.

FIGS. 22 and 23 show a schematic sectional view and a schematic side view of an optoelectronic semiconductor device described herein.

Figure 1:
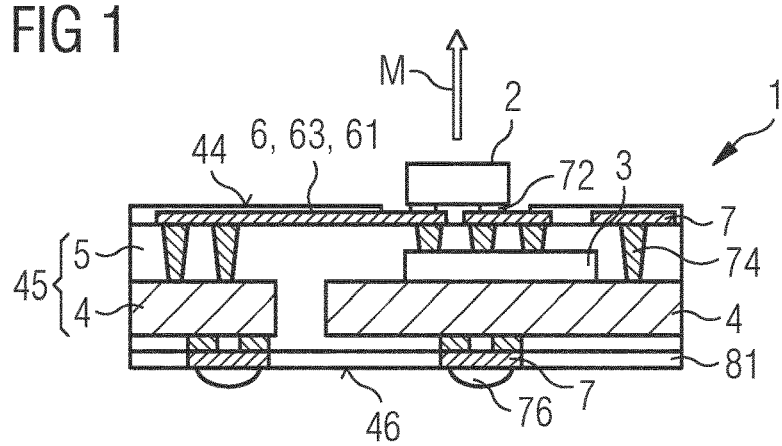
FIG. 1 shows a schematic sectional view of an exemplary embodiment of an optoelectronic semiconductor device.

FIG. 1 shows an exemplary embodiment of an optoelectronic semiconductor device 1. The semiconductor device 1 comprises a carrier 45. The carrier 45 is composed of a plurality of lead frame parts 4 and a matrix material 5 as a supporting component. The matrix material 5 is, for example, an epoxy, in particular a fiber-reinforced epoxy, but may also be a ceramic or a glass. The lead frame parts 4 are preferably each made of a copper sheet or a copper foil.

Further, the carrier 45 comprises an electrical redistribution layer 7, also referred to as RDL, on a mounting side 46 and on a carrier upper side 44, respectively. The redistribution layers 7 are preferably formed by metallizations, for example by galvanically applied copper layers. For example, to improve solderability, the redistribution layers 7 may each comprise further layers not shown.

A laminate layer 81, for example made of a solder resist, is located on the mounting side 46. The redistribution layer 7 at the mounting side 46 is also optionally provided with solder balls 76.

There is also a laminate layer 63 on the carrier upper side 44. This laminate layer 63 is colored white, for example, and forms an optical component 6.

The laminate layer 63 comprises an opening in which an optoelectronic semiconductor chip 2 is located. The semiconductor chip 2 is, for example, an LED chip. Preferably, a plurality of the semiconductor chips 2 are provided, but only one of the semiconductor chips 2 is illustrated to simplify the illustration. The diffuse reflective laminate layer 36 extends almost to the semiconductor chip 2.

The semiconductor chip 2 is attached to the carrier 45 via electrical bonding agents 72, such as a solder or an electrically conductive adhesive. A main emission direction M of the semiconductor chip 2 points away from the mounting side 46.

The lead frame pats 4 as well as the redistribution layers 7 are electrically interconnected via electrical through-connections 74 through the matrix material 5. An electrical interconnection of the semiconductor chips 2 via the lead frame parts 4, the through-connections 74 as well as the redistribution layers 7 is illustrated in the figures only schematically and in a highly simplified manner in each case.

Figure 2:
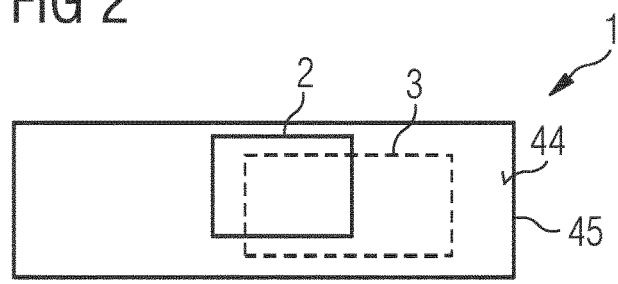
FIG. 2 shows a schematic plan view of an optoelectronic semiconductor device described here.

Seen in a plan view, see FIG. 2, the semiconductor chip 2 and a circuit chip 3 overlap each other. The circuit chip 3 is configured to control the semiconductor chip 2. Preferably, the circuit chip 3 is located entirely within the carrier 45.

In other words, the carrier 45 with the circuit chip 3, for example an ASIC, is used as a substrate for mounting the at least one semiconductor chip 21. Thus, a space-saving assembly is provided. In particular, the carrier 45 is a so-called EASI substrate or a so-called SESUB.

In the following, the respective exemplary embodiments of the semiconductor device 1 are illustrated only for a specific design of the carrier 45. However, other types of construction of the carrier 45 may also be used. In particular, the carrier 45 can also be designed in each case as an alternative to the design of FIG. 1, as illustrated in FIGS. 3, 4, 5 as well as 6.

Figure 3:
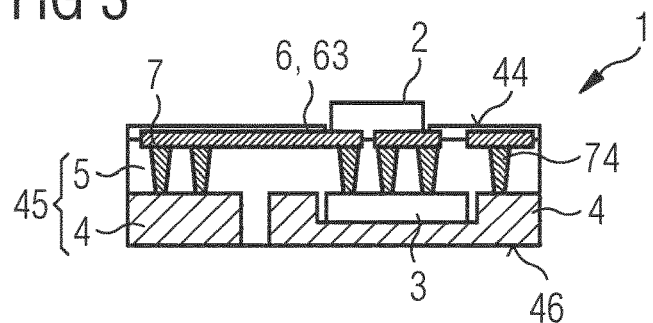
FIGS. 3 to 11 show schematic sectional views of optoelectronic semiconductor devices described herein.

According to FIG. 3, the circuit chip 3 is not located on one of the lead frame parts 4, but in a cutout in one of the lead frame parts 4. Furthermore, the carrier underside 46 is formed by the lead frame parts 4 as well as by the matrix material 5. That is, there is no electrical redistribution layer on the carrier underside 46 in this case.

Figure 4:
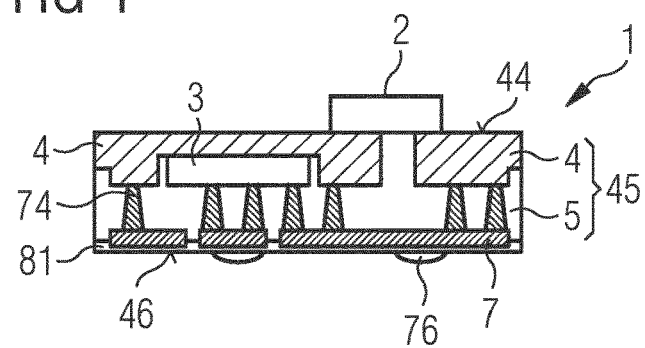

In contrast, according to FIG. 4, the carrier upper side 44 is formed by the lead frame parts 4 and by the matrix material 5. Essentially, the carrier 45 of FIG. 4 corresponds to the carrier of FIG. 3, wherein, however, the mounting side 46 and the carrier upper side 44 are interchanged. Solder balls 76 may be located on the mounting side 46.

Figure 5:
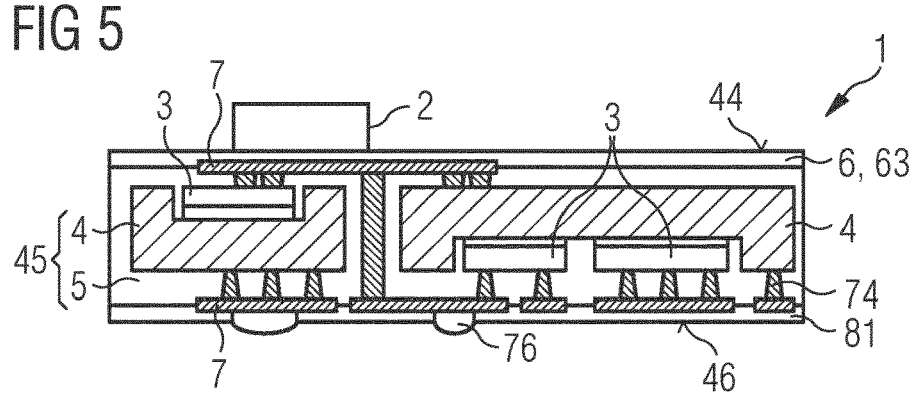

In FIG. 5, it is illustrated that the carrier 45 comprises a plurality of the circuit chips 3, each of which may be accommodated in cutouts in the lead frame parts 4. A more complex interconnection scheme is achievable via the redistribution layers 7 and the through-connections 76. On the mounting side 46 as well as on the carrier upper side 44, the laminate layers 61, 81 and the redistribution layers 7 are preferably located, respectively.

Figure 6:
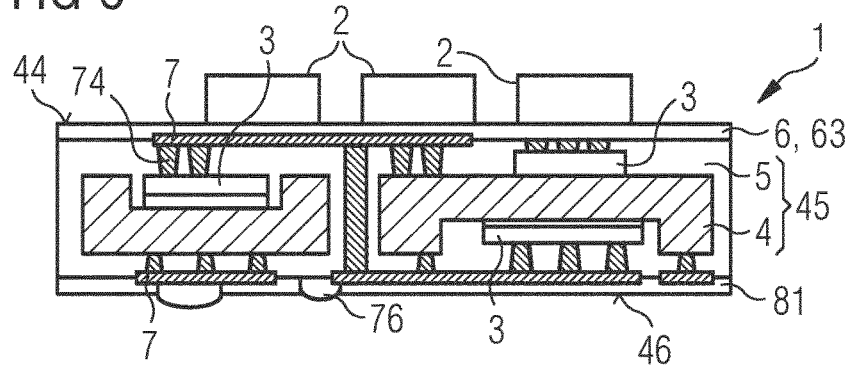

In the exemplary embodiment of FIG. 6, several of the semiconductor chips 2 are schematically shown, as is also possible in all other exemplary embodiments. Light emitting diode chips and detector chips may be present in combination with each other, as is also possible in all other exemplary embodiments. The circuit chips 3 are attached to different sides of the lead frame parts 4 and may each be located in cutouts, in particular back etchings. The laminate layers 61, 81 and the redistribution layers 7 are located on both main sides 44, 46.

With regard to the design of the optical component 6, the explanations regarding the other exemplary embodiments each apply accordingly to the designs of FIGS. 3 to 6.

Figure 7:
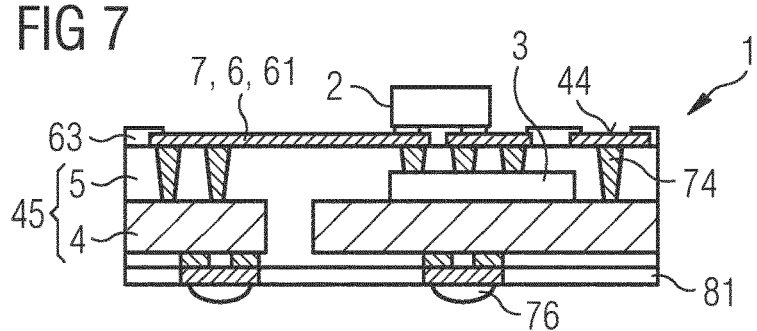

Shown only for the configuration of the carrier 45 of FIG. 1, it is illustrated in FIG. 7 that the optical component 6 is formed by the electrical redistribution layer 7 on the carrier upper side 44. For this purpose, the redistribution layer 7 is provided with a reflective coating, for example of silver. The redistribution layer 7 is exposed over as large an area as possible on the carrier upper side 44 and is preferably covered only to a very small extent by the laminate layer 63. To protect the redistribution layer 7 and to maintain a reflectivity for a long time, a protective layer not shown may be present, for example of silicon dioxide or of a nitride such as aluminum nitride.

Figure 8:
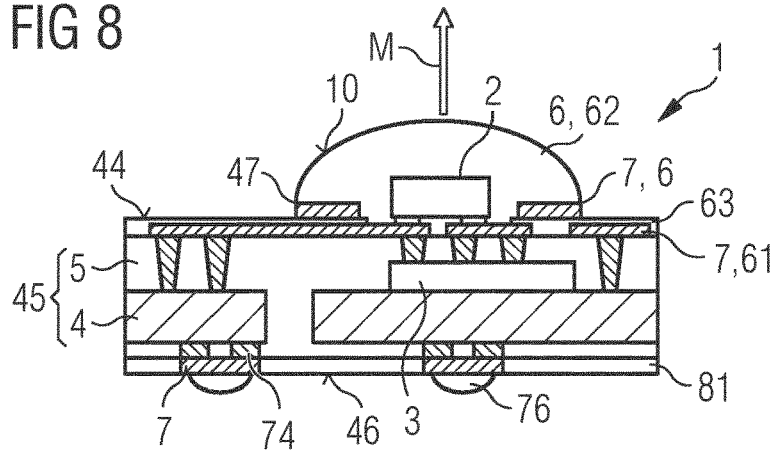

In the exemplary embodiment of FIG. 8, it is shown that the optical component 6 is additionally formed by a lens 62, in addition to the reflective redistribution layer 7 on the carrier upper side 44, with the uppermost redistribution layer 7 being located in places on the upper laminate layer 63.

The top laminate layer 7, 6 is formed as a structural edge 47 for the lens 62. That is, when material for the lens is dispensed, this material extends exactly to the structural edge 47. Thus, a shape and a light exit side 10 of the lens 62 can be produced in a defined manner. The main emission direction M is oriented approximately perpendicular to the mounting side 46.

Figure 9:
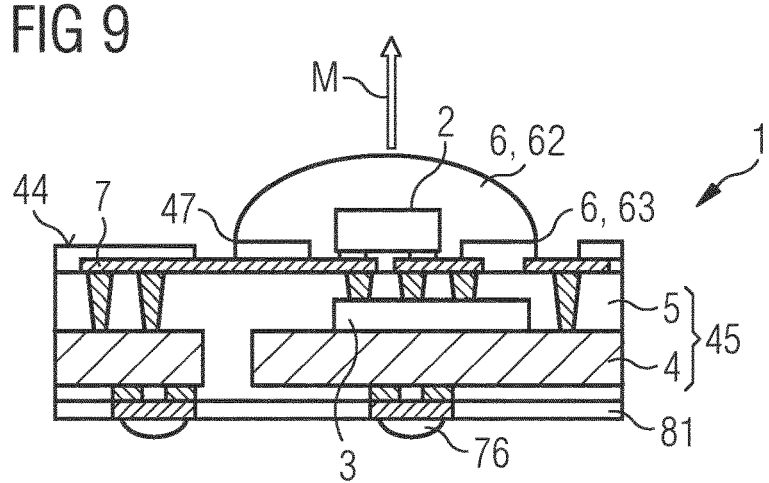

In the exemplary embodiment of FIG. 9, it is shown that the structural edge 47 for defining the lens 62 is formed by the laminate layer 63 on the carrier upper side 44. The laminate layer 63 is structured accordingly. The structural edge 47 is preferably formed by a trench which extends to the upper redistribution layer 7 and which preferably completely surrounds the lens 62.

Figure 10:
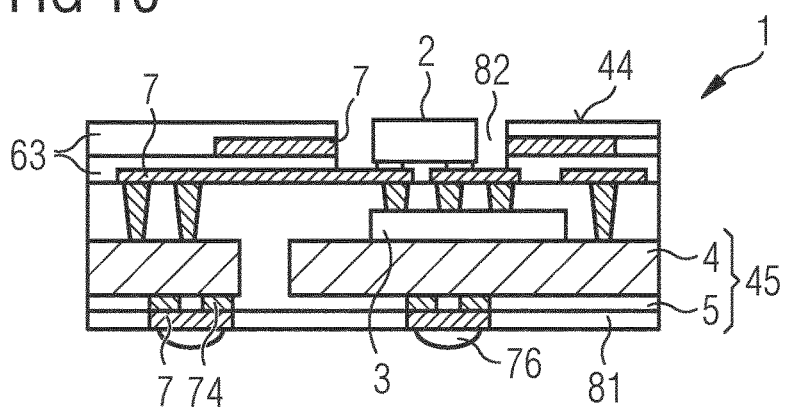

In FIG. 10, it is shown that a multilayer structure of laminate layers 63 and redistribution layers 7 is present on the carrier upper side 44. A recess 82 is defined by the laminate layers 63 together with the uppermost redistribution layer 7. Preferably, both the top two redistribution layers 7 and the laminate layers 63 are formed to be reflective. It is possible that the semiconductor chip 2 is completely located in the recess 82.

Figure 11:
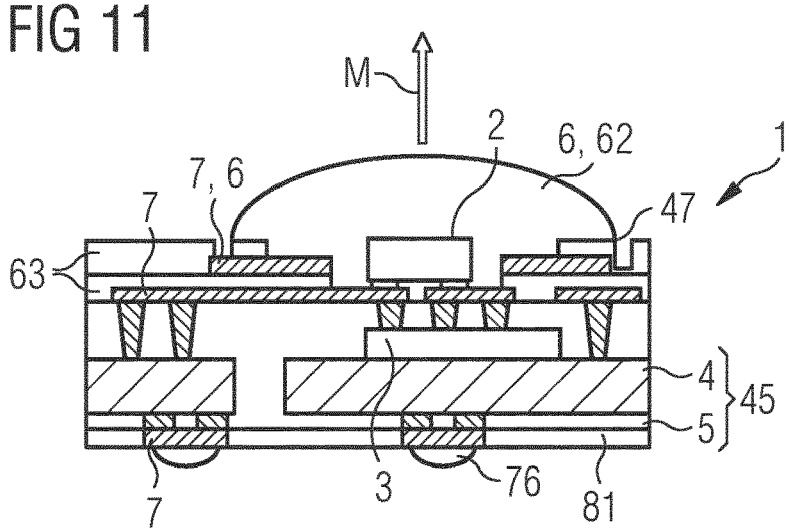

In FIG. 11, there are also a plurality of laminate layers 63 and a top redistribution layer 7. Trenches in the top laminate layer 63 and/or in the top redistribution layer 7 define the shape of the lens 62. Thus, the structural edge 47 for defining the shape of the lens 62 is optionally multilayered.

The uppermost redistribution layers 7 of FIGS. 8, 10 and 11 are preferably electrically non-functionalized. That is, these redistribution layers 7 preferably serve only as optical components 6 and/or for adjusting the shape of the lens 62.

Preferably, as few redistribution layers 7, or RDLs for short, are used as possible to enable a low-cost structure of the semiconductor device 1.

Figure 12:
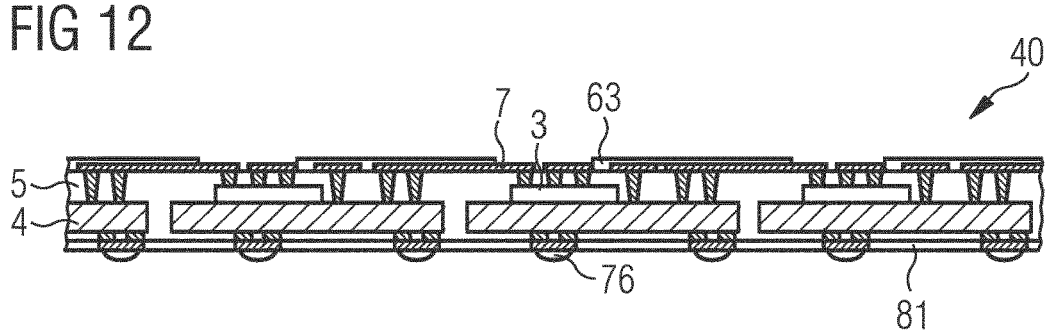
FIGS. 12 to 14 show schematic sectional views of method steps of a method described herein.
Figure 13:
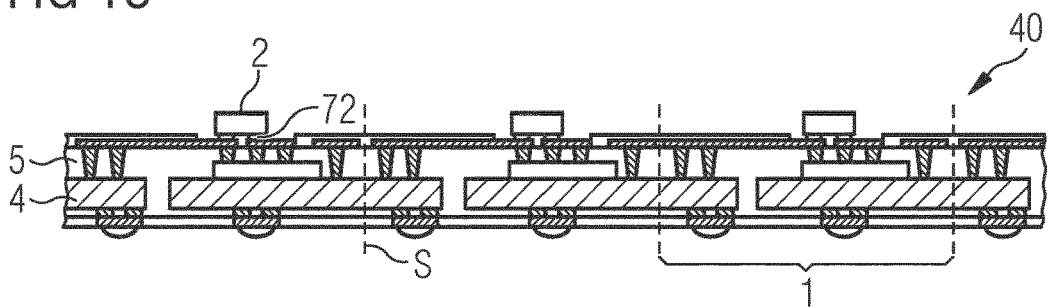
Figure 14:
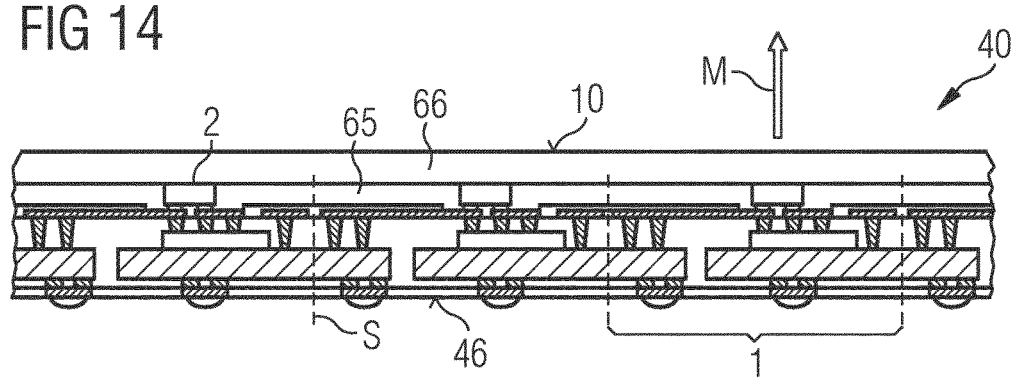

FIGS. 12 to 14 show an example of a manufacturing method for optoelectronic semiconductor devices 1. Referring to FIG. 12, a carrier assembly 40 is provided which includes many of the subsequent carriers for the semiconductor devices 1. The carrier assembly 40 is preferably a continuous plate comprising the circuit chips 3. Already in the state of the carrier assembly 40, as illustrated in FIG. 12, a testing of the circuit chips 3 optionally is carried out.

In the step of FIG. 13, it is shown that the semiconductor chips 2 are each applied to the corresponding unit for the subsequent carriers 45. Separation into the semiconductor devices 1 takes place along separation lines S completely through the carrier assembly 40. The separation lines S are preferably arranged at a distance from the semiconductor chips 2 as well as from the circuit chips 3.

In the optional method step of FIG. 14 it is shown that the semiconductor chips 2 can be embedded in an embedding layer 65. The embedding layer 45 can be flush with the semiconductor chips 2 in the direction away from the mounting side 46. The embedding layer 65 is preferably made of a diffuse white reflective material, for example a silicone filled with titanium dioxide particles.

In addition, according to FIG. 14, an out-coupling layer 66 is optionally present, which may cover all semiconductor chips 2 as well as the embedding layer 65 as a continuous layer. The out-coupling layer 66 is preferably made of a transparent material. The main emission direction M is correspondingly oriented away from the mounting side 46. Optionally, the out-coupling layer may include scattering particles for light scattering or luminescent substances for wavelength conversion of a radiation generated by the semiconductor chips 2. Such an embedding layer 65 and/or such an out-coupling layer 66 may also be present in all exemplary embodiments.

Figure 15:
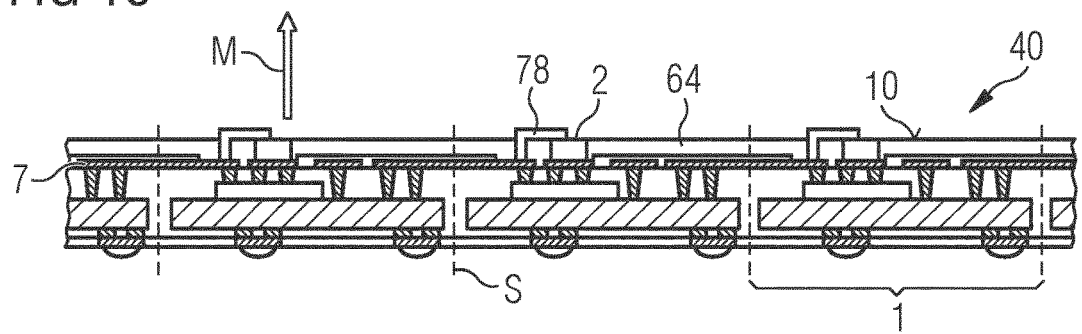
FIG. 15 shows a schematic sectional view of a method step of a method described herein.

The semiconductor chips 2 of FIGS. 1 to 14 shown so far are formed as flip chips. In contrast, semiconductor chips 2 with electrical contact regions on opposite main sides can also be used, see FIG. 15. For electrical contacting of the semiconductor chips 2, contacting structures 78 can be used which are configured as a through-connection to a top redistribution layer 7 and which are also formed by a conductor path running flat on the cover layer 64. Alternatively to flip chips, such a type of contacting may also be relied upon in all other exemplary embodiments. Furthermore, contacting is possible with the aid of bonding wires. In this case, all electrical connections can be placed on a side facing away from the lead frame parts 40, so that two or more than two bonding wires are then used for electrical contacting on this side.

Figure 16:
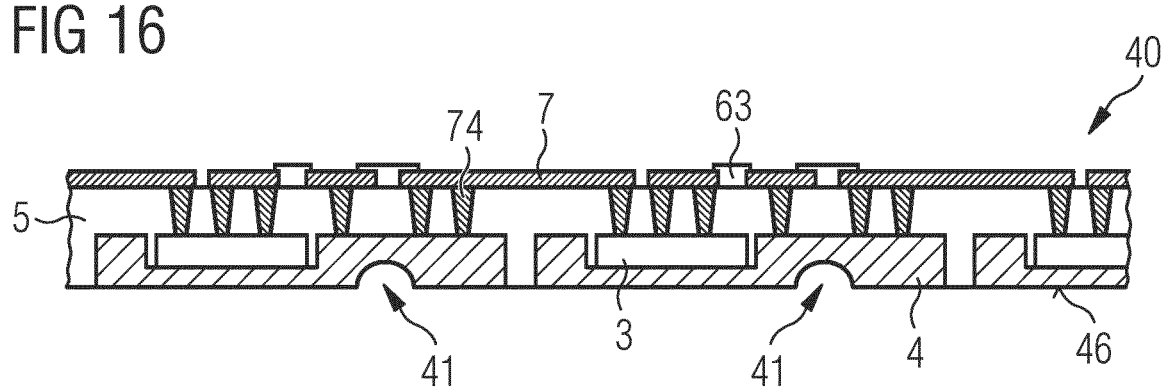
FIGS. 16 and 17 show schematic sectional views of method steps of a method described here.
Figure 17:
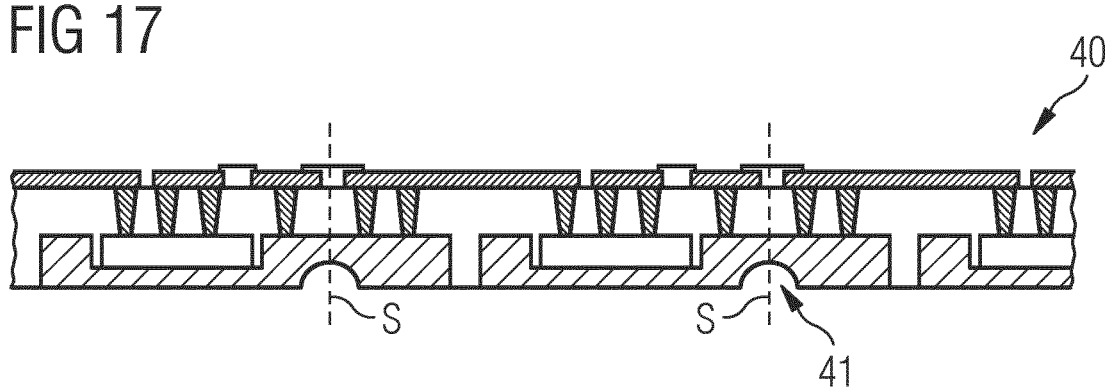
Figure 18:
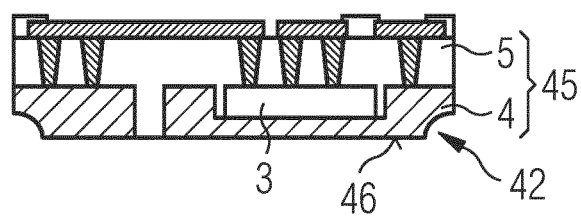
FIG. 18 shows a schematic sectional view of a carrier for optoelectronic semiconductor devices described herein.

In the method of FIGS. 16 and 17 it is shown how the semiconductor devices 1 can be produced with carriers of the type in particular of FIG. 3. Optionally, back etchings 41, i.e. recesses, can be created in the lead frame parts 4 from the mounting side 46. These back etchings 41 are located in the region of the separation lines S, see FIG. 17.

This allows solder control points 42 to be formed on the side surfaces of the carriers 45. The solder control points 42 are preferably provided with a coating wetting for solder, not shown. The solder control points 42 preferably do not extend to the matrix material 5 of the side surfaces of the carrier 45.

Figure 19:
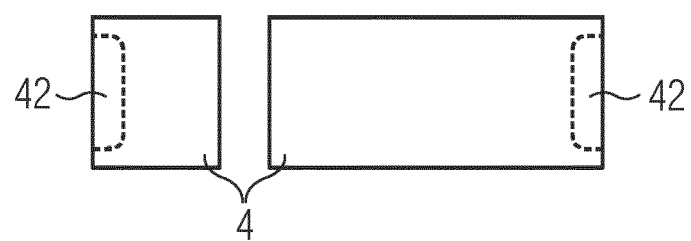
FIG. 19 shows a schematic top view of lead frame parts for optoelectronic semiconductor devices described herein.

Corresponding lead frame parts 4 are shown in the schematic plan view of FIG. 19, wherein only the lead frame parts 4 are shown. The solder control points 42 are exposed on only one side surface of the carrier 45 per lead frame part 4, for example. Seen in a plan view, the solder control points 42 are preferably surrounded in a U-shape all around by a material of the lead frame parts 4.

Alternatively or in addition, the solder control points may be placed on opposite sides of a particular lead frame part. Thus, alternatively or in addition to the solder control points 42 drawn in FIG. 19, solder control points may be provided on the larger and/or on the smaller lead frame part 4 on the sides lying above and below in FIG. 19, i.e. in particular on opposite sides running parallel or substantially parallel to a longitudinal axis of the assembly of the two lead frame parts 4. In a direction perpendicular to such a longitudinal axis, the solder control points may be opposite to each other or be arranged offset from each other.

In FIGS. 16 to 19, such solder control points 42 are shown only for the lead frame parts 4. Analogously, however, such solder control points 42 may alternatively or additionally be provided on the redistribution layers 7.

FIGS. 20 and 21 show different sectional views of the carrier 45. The sectional view of FIG. 21 corresponds to a section along the dash line of FIG. 20. The solder control points 42 and thus back etchings 41 can accordingly be oriented transversely in comparison with FIGS. 16 to 19.

Furthermore, solder pads 77 can be defined not only on the lead frame parts 4 but also on the redistribution layer 7. With respect to their width and height, the solder pads 77 can be balanced. With such a configuration, as shown in FIGS. 20 and 21, in particular laterally emitting semiconductor devices 1 can be produced, whose main emission direction is transverse to the mounting side 46.

Preferred configurations of laterally emitting semiconductor devices 1 are explained in more detail in FIGS. 22 to 31. In FIGS. 22 and 23, an exemplary embodiment of the semiconductor device 1 is shown, see the sectional view of FIG. 22 and the side view of FIG. 23 of the light exit side 10.

The lens 62, which together with the redistribution layer 7 forms the optical components 6, is approximately hyperbolic and/or paraboloidal in cross-section according to FIG. 22. The lens 62 is exposed at the light exit side 10 and is flush with the matrix material 5, in a direction parallel to the mounting side 46. The lens is completely covered by the cover layer 64. This results in a particularly diffuse reflection of the light generated by the semiconductor chip 2 in operation at the cover layer 64 towards the direction parallel to the mounting side 46.

Seen in side view, see FIG. 23, the lens 62 preferably appears approximately semicircular. Due to the cover layer 64, the semiconductor device 1 may comprise an overall rectangular cross-section. A shaping of the lens 62 is preferably again performed via a structural edge 47, analogous to FIG. 8, 9 or 11.

Figure 24:
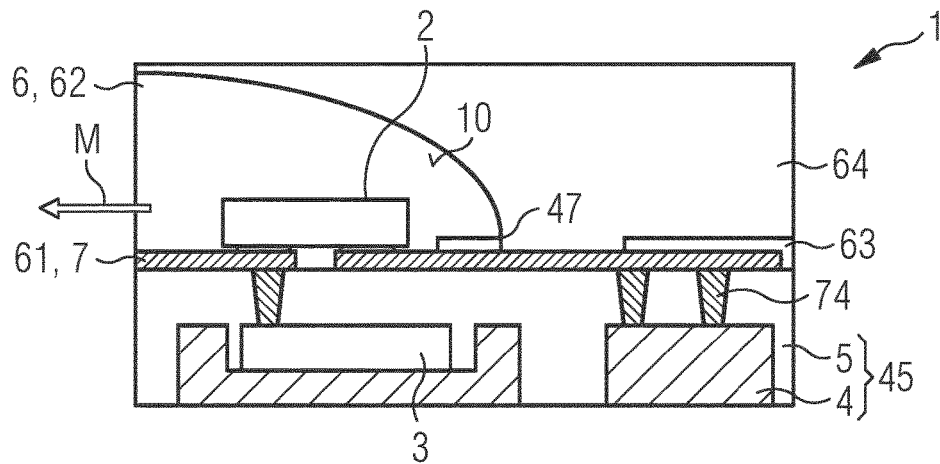
FIG. 24 shows a schematic sectional view of an optoelectronic semiconductor device described herein.

In FIG. 24 a further exemplary embodiment of the semiconductor device 1 is illustrated. Unlike in FIG. 23, no laminate layer 63 is present at a cut edge of the lens 62. In all other respects, the exemplary embodiment of FIG. 24 corresponds to that of FIGS. 22 and 23.

Figure 25:
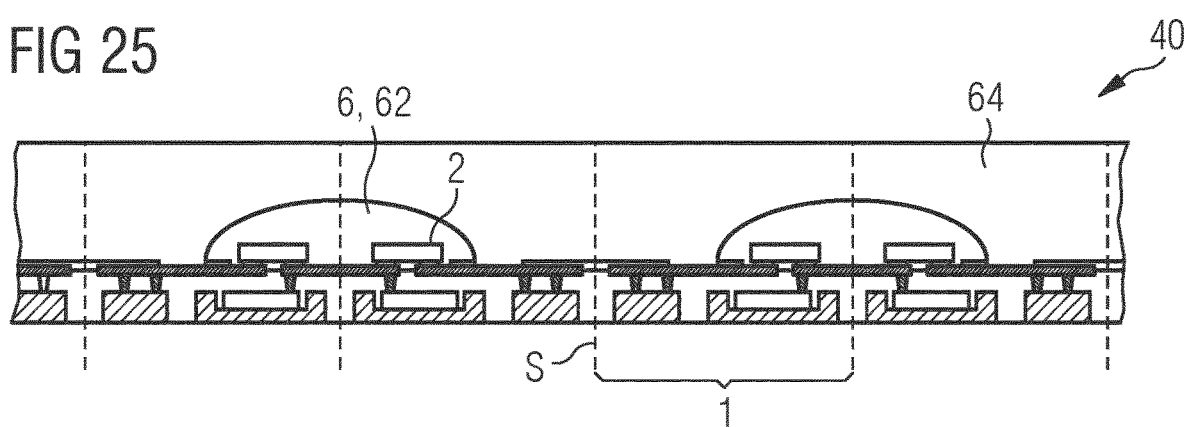
FIG. 25 shows a schematic sectional view of a method step of a method described herein.

In FIG. 25, a manufacturing method for the semiconductor devices 1 of FIGS. 22 to 24 is explained schematically. The lenses 62 are manufactured as approximately circular solid lenses when viewed in a plan and approximately semicircular solid lenses when viewed in cross section. Since the separation lines S preferably extend centrally through the lens 62, the geometry of the lenses 62 is formed as explained in FIGS. 22 to 24.

The cover layer 64 is produced, for example, by film assisted molding, or FAM for short. It is also possible to build up the cover layer 64 by first creating a dam, for example from a so-called glob top, wherein subsequently a filling of the dam is carried out with a material for the cover layer 64. The cover layer 64 is thus not necessarily cuboidal in cross-section and can be built up from several components.

Figure 26:
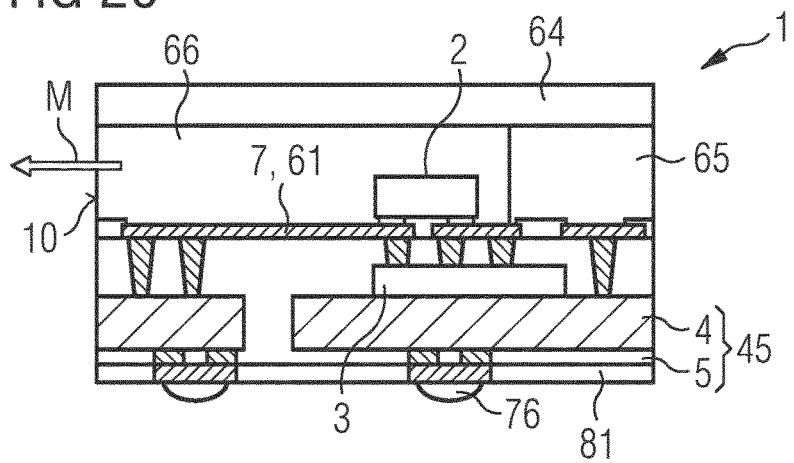
FIGS. 26 to 31 show schematic sectional views of optoelectronic semiconductor devices described herein.

FIG. 26 also shows a side emitter. Instead of a lens, there is a light-transmitting out-coupling layer 66 which is optionally provided with a luminescent substance. Seen in cross-section, the out-coupling layer 66 is approximately rectangular. The embedding layer 65 is generated via FAM, for example, and defines a subsequent shape of the out-coupling layer 66, which is preferably manufactured subsequently. The embedding layer 65 is preferably diffusely reflective and may appear white. The embedding layer 65 as well as the out-coupling layer 66 are optionally jointly covered by the preferably likewise diffusely reflective, white-appearing cover layer 64. The semiconductor device 1 of FIG. 26 can also be manufactured analogously to FIG. 25.

It is not necessary that the lens 62 or the out-coupling layer 66 of FIGS. 22 to 26 are exposed only on one side surface of the semiconductor device 1. Thus, two side surfaces can be provided with the lens 62 or with the out-coupling layer 66 via appropriate formation of the separation lines S. In the case of an out-coupling layer 66, it may also be exposed on three side surfaces.

Figure 27:
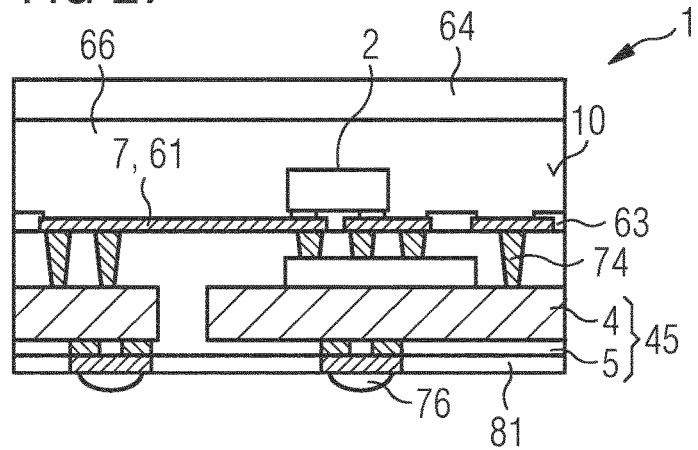

If the out-coupling layer 66 is formed as a continuous, coherent layer, so that in particular no embedding layer 65 is present, the out-coupling layer 66 can also be exposed all around, so that light is emitted in the lateral direction all around. This is illustrated in FIG. 27.

In the exemplary embodiments of FIGS. 1 to 27, the carrier 45 is formed in each case as a type of circuit board or printed circuit board. In contrast, FIGS. 28 to 31 show designs of the semiconductor device 1 that are formed in a QFN-like manner. For this purpose, the lead frame parts 4 are each embedded in the matrix material 5 and are mechanically firmly connected to each other via the matrix material 5. The matrix material can again be a plastic, but ceramics or glasses can also be used.

In each case, the circuit chip 3 is embedded in the matrix material 5. Electrical contact is made with the circuit chip 3, for example, via bonding wires 71. The carrier 45 is thus relatively thick in the region of the circuit chip 3. In contrast, the semiconductor chip 2 is applied to one or more of the lead frame parts 4. In the region of the semiconductor chip 2, the carrier 45 is comparatively thin.

Figure 28:
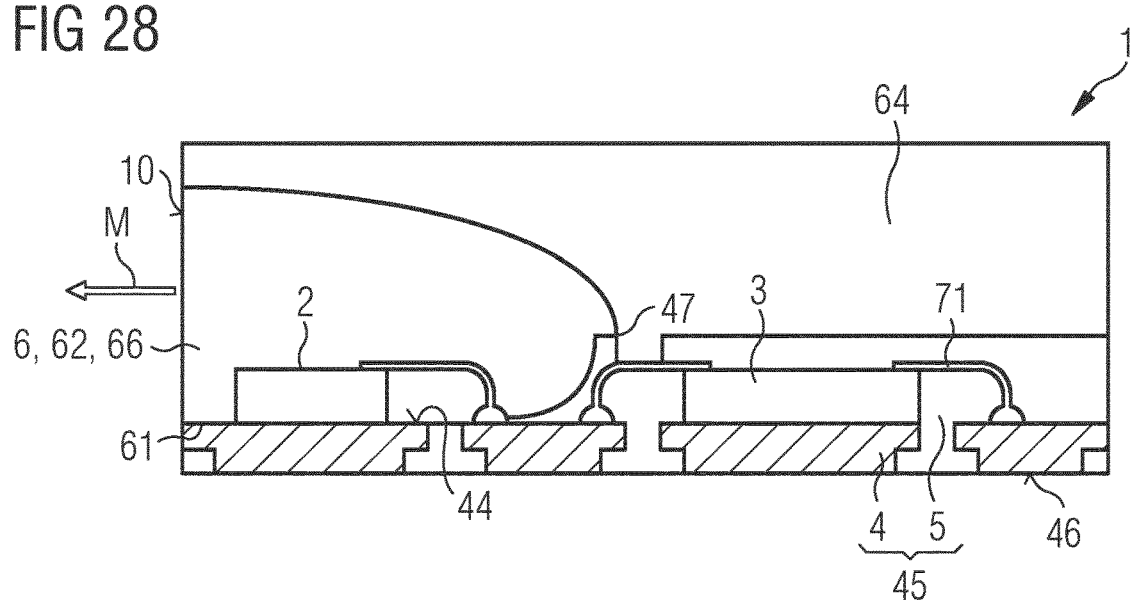

According to FIG. 28, the lens-shaped out-coupling layer 66 is located above the semiconductor chip 2. A shape of the out-coupling layer 66 is defined in the matrix material 5 via the structural edge 47. The out-coupling layer 66 and the matrix material 5 are in contact with each other. Optionally, the matrix material 5 and the lens 62 are covered by the cover layer 64, analogous, for example, to FIG. 24.

Figure 29:
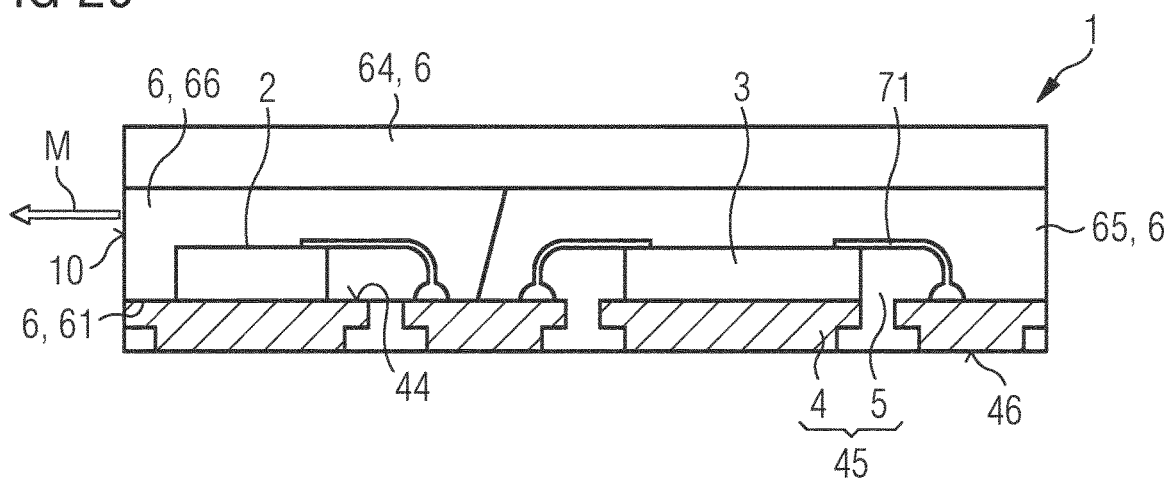

In FIG. 29 it is illustrated that the lateral emission of the semiconductor device 1 is achieved via the out-coupling layer 66 which is trapezoidal in cross-section, for example. In a direction away from the mounting side 46, the out-coupling layer 66 as well as the matrix material 5 may be flush with each other and jointly covered by the cover layer 64, analogously to FIG. 26.

Figure 30:
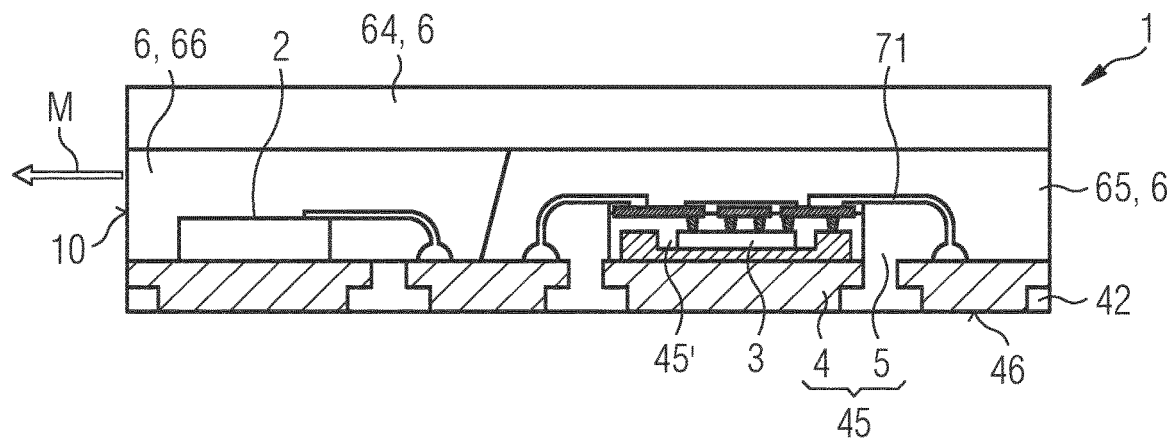
Figure 31:
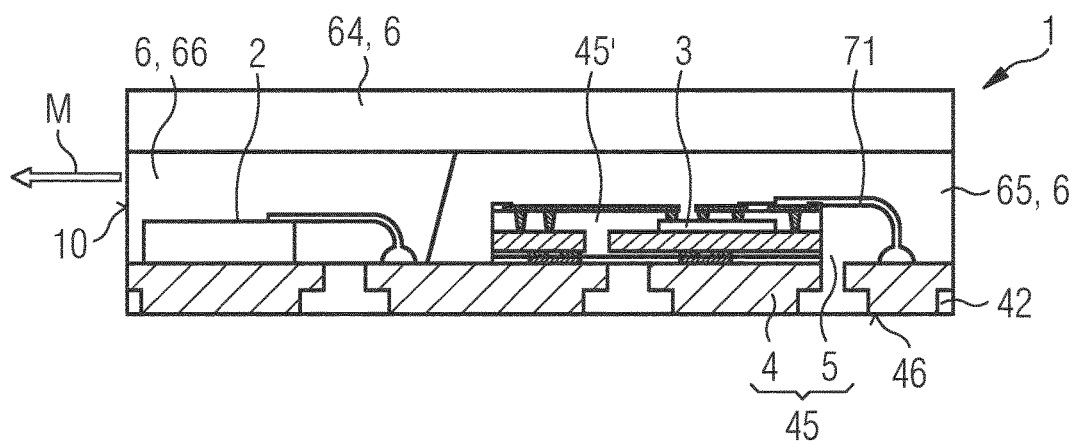

In FIGS. 30 and 31 it is illustrated that the circuit chip 3 may be integrated in a subcarrier 45'. The subcarrier 45' is in particular formed as illustrated in connection with FIGS. 1 to 6, but preferably without an optoelectronic semiconductor chip. The devices 1 of FIGS. 30 and 31 may thus represent carrier-in-carrier configurations.

Deviating from FIGS. 28 to 30, it is not necessary that the circuit chip 3 of FIG. 31 or the subcarrier 45' be mounted on a single one of the lead frame parts 4. Thus, the circuit chip 3 or the subcarrier 45' may extend over several of the lead frame parts 4. It is thus also possible that additional electrical contacting, for example via bonding wires 71, may be omitted. In all other respects the components of FIGS. 30 and 31 correspond to those of FIG. 29.

Semiconductor devices described here can be used, for example, in reflex light barriers, or RLS for short.

Unless otherwise indicated, the components shown in the figures preferably follow one another directly in the order indicated. Layers not touching each other in the figures are preferably spaced apart. Where lines are drawn parallel to each other, the corresponding surfaces are preferably also aligned parallel to each other. Likewise, unless otherwise indicated, the relative positions of the drawn components to each other are correctly reproduced in the figures.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

This patent application claims priority to German patent application 10 2019 104 325.5, the disclosure content of which is hereby incorporated by reference.

REFERENCES 1 optoelectronic semiconductor device
10 light exit side
2 optoelectronic semiconductor chip
3 circuit chip
4 lead frame part
40 carrier assembly
41 back etching
42 solder control point
44 carrier upper side
45 carrier
46 mounting side
47 structural edge
5 matrix material
6 optical component
61 reflection layer
62 lens
63 laminate layer
64 cover layer
65 embedding layer
66 out-coupling layer
7 electrical redistribution layer
71 bonding wire
72 electrical bonding agent
74 electrical through-connection
76 solder ball
77 solder pad
78 contacting structure
81 further laminate layer
82 recess
M main emission region
S separation lines

The invention claimed is:

1. An optoelectronic semiconductor device with
at least two metallic lead frame parts, each of which is a solid metal body produced by means of at least one of stamping, cutting, or etching,
at least one circuit chip on at least one of the lead frame parts,
an electrically insulating and opaque matrix material which mechanically connects the lead frame parts to one another and in which the circuit chip is embedded, so that a carrier is formed by the matrix material together with the lead frame parts and the circuit chip,
a plurality of optoelectronic semiconductor chips, at least one of the plurality of optoelectronic semiconductor chips is located on a carrier upper side of the carrier, and the carrier upper side is opposite to a mounting side, and
at least one optical component on the carrier upper side, wherein
the carrier comprises at least one laminate layer,
the carrier upper side is formed in places by the laminate layer; and
the optoelectronic semiconductor chips are electrically independently controllable by means of the circuit chip individually or in several groups, wherein the semiconductor device comprises a data input interface which is common to all optoelectronic semiconductor chips and is electrically connected directly to the circuit chip.

2. The optoelectronic semiconductor device according to claim 1,
further comprising at least one electrical redistribution layer electrically connected via electrical through-connections with at least one of the lead frame parts,
wherein
the circuit chip and the optoelectronic semiconductor chip are located in different planes parallel to the mounting side,
the circuit chip and the optoelectronic semiconductor chip overlap with each other as seen in a plan view,
the optical component or at least one of the optical components is formed by a reflection layer and the optoelectronic semiconductor chip rises above the reflection layer in a direction away from a mounting plane, and
the optoelectronic semiconductor chip or at least one of the optoelectronic semiconductor chips is a light-emitting diode chip arranged at a distance from the circuit chip.

3. The optoelectronic semiconductor device according to claim 2,
wherein the optoelectronic semiconductor chip or at least one of the optoelectronic semiconductor chips is arranged on or in the redistribution layer.

4. The optoelectronic semiconductor device according to claim 2,
comprising a plurality of said redistribution layers,
wherein the circuit chip is disposed between two redistribution layers, and one of the redistribution layers is located between the circuit chip and the optoelectronic semiconductor chip or at least one of the optoelectronic semiconductor chips.

5. The optoelectronic semiconductor device according to claim 1,
wherein the circuit chip and/or the optoelectronic semiconductor chip or at least one of the optoelectronic semiconductor chips is located in at least one recess in at least one of the lead frame parts.

6. The optoelectronic semiconductor device according to claim 1,
wherein the optical component or at least one of the optical components is formed by a lens,
wherein the lens is bounded by a structural edge on the carrier upper side in a direction parallel to the mounting side,
wherein the structural edge is formed in multiple layers.

7. The optoelectronic semiconductor device according to claim 6,
wherein a plurality of said optical components are provided and one of the optical components is formed by an opaque diffuse reflective cover layer,
wherein the cover layer partially or completely covers the lens on a side facing away from the carrier.

8. The optoelectronic semiconductor device according to claim 1,
wherein a plurality of said optical components are present and said laminate layer forms one of the optical components.

9. The optoelectronic semiconductor device according to claim 1,
wherein the at least one of the optoelectronic semiconductor chips is embedded in an embedding layer, the embedding layer is located on the carrier upper side and is flush with the at least one semiconductor chips in the direction away from the carrier upper side, the embedding layer is made of a diffuse white reflective material.

10. The optoelectronic semiconductor device according to claim 1,
whose main emission direction is oriented parallel to the mounting side with a tolerance of at most 20°.

11. The optoelectronic semiconductor device according to claim 10,
in which the optical component or at least one of the optical components or all the optical components are flush with the carrier in a direction parallel to the mounting side.

12. An optoelectronic semiconductor device with
at least two metallic lead frame parts, each of which is a solid metal body produced by means of at least one of stamping, cutting, or etching,
at least one circuit chip on at least one of the lead frame parts,
an electrically insulating and opaque matrix material which mechanically connects the lead frame parts to one another and in which the circuit chip is embedded, so that a carrier is formed by the matrix material together with the lead frame parts and the circuit chip,
at least one optoelectronic semiconductor chip, located on a carrier upper side of the carrier, and the carrier upper side is opposite to a mounting side, and
at least one optical component on the carrier upper side;
wherein:
the optical component or at least one of the optical components is formed by a lens,
the lens is bounded by a structural edge on the carrier upper side in a direction parallel to the mounting side,
the structural edge is formed in multiple layers,
a plurality of said optical components are provided and one of the optical components is formed by an opaque diffuse reflective cover layer, and
the cover layer partially or completely covers the lens on a side facing away from the carrier.

13. The optoelectronic semiconductor device according to claim 1,
wherein the lead frame parts are exposed at side surfaces of the carrier,
wherein the lead frame parts each comprise at least one solder control point on the side surfaces, which is formed by a laterally exposed cutout in the respective lead frame part.

14. The optoelectronic semiconductor device according to claim 1,
wherein the carrier is a printed circuit board for the optoelectronic semiconductor chip in which the circuit chip is integrated.

15. A manufacturing method for optoelectronic semiconductor devices according to claim 1, comprising the following steps:
A) Providing carriers in the carrier assembly;
B) Applying the optoelectronic semiconductor chips to the carriers;

C) Producing at least some of the optical components by dispensing a material for the at least some of the optical components; and D) Separating each carrier having respective circuit chip, optoelectronic semiconductor chip and optical component to form the semiconductor devices.

16. The method according to claim 15, wherein at least some of the optical components are formed by lenses, wherein the separating in step D) is performed through the lenses so that the main emission directions of the semiconductor devices after step D) are oriented parallel to the mounting sides with a tolerance of at most 20°.

17. The optoelectronic semiconductor device according to claim 12,
comprising a plurality of said optoelectronic semiconductor chips,
wherein the optoelectronic semiconductor chips are electrically independently controllable by means of the circuit chip individually or in several groups, wherein the semiconductor device comprises a data input interface which is common to all optoelectronic semiconductor chips and is electrically connected directly to the circuit chip.

18. An optoelectronic semiconductor device, comprising:
at least two metallic lead frame parts, each of which is a solid metal body produced by means of at least one of stamping, cutting, or etching,
at least one circuit chip on at least one of the lead frame parts,
an electrically insulating and opaque matrix material which mechanically connects the lead frame parts to one another and in which the circuit chip is embedded, so that a carrier is formed by the matrix material together with the lead frame parts and the circuit chip,
at least one optoelectronic semiconductor chip, located on a carrier upper side of the carrier, and the carrier upper side is opposite to a mounting side, and
at least one optical component on the carrier upper side wherein:
the circuit chip is located in a cutout of one of the lead frame parts, the cutout of the respective lead frame part has a reduced thickness in a central portion thereof; and
the circuit chip and the optoelectronic semiconductor chip are located in different planes parallel to the mounting side and the circuit chip and the optoelectronic semiconductor chip overlap with each other as seen in a plan view.

19. The optoelectronic semiconductor device of claim 18, further comprising:
a plurality of circuit chips; and
a plurality of optoelectronic semiconductor chips;
wherein:
at least some of the plurality of circuit chips are located in cutouts located in at least two of the lead frame parts; and
at least some of the plurality of optoelectronic semiconductor chips overlap with control chips as seen in the plan view.

20. The optoelectronic semiconductor device of claim 19, wherein there is a second cutout facing the carrier upper side and there is a third cutout facing away from the carrier upper side.

* * * * *